(12) United States Patent
Boese et al.

(10) Patent No.: US 10,727,832 B2
(45) Date of Patent: Jul. 28, 2020

(54) ELASTOMER-BASED CAPACITIVE CONTROL AND OPERATING ELEMENT

(71) Applicant: FRAUNHOFER-GESELLSCHAFT ZUR FOERDERUNG DER ANGEWANDTEN FORSCHUNG E.V., Munich (DE)

(72) Inventors: Holger Boese, Wuerzburg (DE); Deniz Ocak, Wuerzburg (DE); Christopher Kappenberger, Baiersdorf (DE); Johannes Ehrlich, Wiesenbronn (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 16/095,463

(22) PCT Filed: Apr. 21, 2017

(86) PCT No.: PCT/EP2017/059548
§ 371 (c)(1),
(2) Date: Oct. 22, 2018

(87) PCT Pub. No.: WO2017/182649
PCT Pub. Date: Oct. 26, 2017

(65) Prior Publication Data
US 2019/0131969 A1 May 2, 2019

(30) Foreign Application Priority Data

Apr. 22, 2016 (DE) .................. 10 2016 107 533

(51) Int. Cl.
*H03K 17/975* (2006.01)
*H03K 17/96* (2006.01)
(Continued)

(52) U.S. Cl.
CPC ............ *H03K 17/975* (2013.01); *G01L 1/142* (2013.01); *G01L 1/146* (2013.01); *G01L 1/148* (2013.01);
(Continued)

(58) Field of Classification Search
CPC .. H03K 17/975; H03K 17/945; H03K 17/962; G01L 1/146; G01L 1/148;
(Continued)

(56) References Cited

U.S. PATENT DOCUMENTS 4,742,196 A * 5/1988 Kelly ................. H01B 7/10
200/85 R
5,559,665 A 9/1996 Taranowski et al.
(Continued)

FOREIGN PATENT DOCUMENTS

DE 102010063280 A1 2/2012
DE 102012210277 B3 8/2013
(Continued)

OTHER PUBLICATIONS

Matysek, M., et al.: "Combined driving and sensing circuitry for dielectric elastomer actuators in mobile applications". Proc. SPIE 7976, Electroactive Polymer Actuators and Devices (EAPAD) 2011, 797612 (Mar. 28, 2011); doi: 10.1117/12.879438, San Diegeo, Carlifomia, United States.
(Continued)

*Primary Examiner* — Edwin A. Leon
(74) *Attorney, Agent, or Firm* — Laurence A. Greenberg; Werner H. Stemer; Ralph E. Locher

(57) ABSTRACT

A control and operating element has at least one dielectric elastomer sensor in which at least two electrode layers, between which a capacitance can be measured, are separated from one another by an at least partially elastomeric dielectric. The sensor has a preset position and can, due to a
(Continued)

deformation of elastomeric components, adopt one or more working positions in which the capacitance is changed with respect to the preset position and which is/are reached due to application of an external force. The control and operating element further has a triggering mechanism which can trigger an event that is associated with a reached working position.

22 Claims, 9 Drawing Sheets

(51) Int. Cl.
 *G01L 1/14* (2006.01)
 *H03K 17/945* (2006.01)
(52) U.S. Cl.
 CPC ......... *H03K 17/945* (2013.01); *H03K 17/962* (2013.01)
(58) Field of Classification Search
 CPC ........ H01H 3/142; H01H 11/00; H01H 1/029; H01H 3/60; H01H 2003/143
 USPC .................. 200/600, 61.42–61.44, 61.62
 See application file for complete search history.

(56) References Cited

U.S. PATENT DOCUMENTS

| | | | | |
|---|---|---|---|---|
| 6,078,014 A | * | 6/2000 | Kashiwazaki | H01B 7/104 200/61.43 |
| 7,863,822 B2 | | 1/2011 | Stoschek et al. | |
| 9,202,644 B2 | * | 12/2015 | Aoyama | H01H 3/60 |
| 9,570,247 B2 | * | 2/2017 | Clemente | F16P 3/12 |
| 9,638,587 B2 | | 5/2017 | Marquas et al. | |
| 2011/0169513 A1 | * | 7/2011 | Bolbocianu | E05F 15/443 324/705 |
| 2013/0127782 A1 | | 5/2013 | Lochner et al. | |
| 2014/0255490 A1 | | 9/2014 | Luebbe et al. | |
| 2017/0199022 A1 | | 7/2017 | Anderson et al. | |

FOREIGN PATENT DOCUMENTS

| | | |
|---|---|---|
| DE | 102013004088 A1 | 9/2014 |
| DE | 102014201434 A1 | 7/2015 |
| EP | 0726655 A1 | 8/1996 |
| EP | 2698616 A2 | 2/2014 |
| WO | 2016003293 A1 | 1/2016 |

OTHER PUBLICATIONS

Boese, H., et al.: "Novel dielectric elastomer sensors for compression load detection". Proc. SPIE 9056, Electroactive Polymer Actuators and Devices (EAPAD) 2014, 905614 (Mar. 8, 2014); doi: 10.1117/12.2045133 Event: SPIE Smart Structures and Materials + Nondestructive Evaluation and Health Monitoring, 2014, San Diego, California, United States.

Lee, H.-K., et al.: Normal and Shear Force Measurement Using a Flexible Polymer Tactile Sensor With Embedded Multiple Capacitors. In: IEEE Journal of Micro electromechanical Systems, vol. 17, 2008, No. r, S. 934-942.—ISSN 1941-0158.

Boese, H., et al.: "Applications of pressure-sensitive dielectric elastomer sensors". SPIE—International Society for Optical Engineering. Proceedings, S I E International Society for Optical Engineering, US, Bd. 9798, Apr. 15, 2016.

* cited by examiner

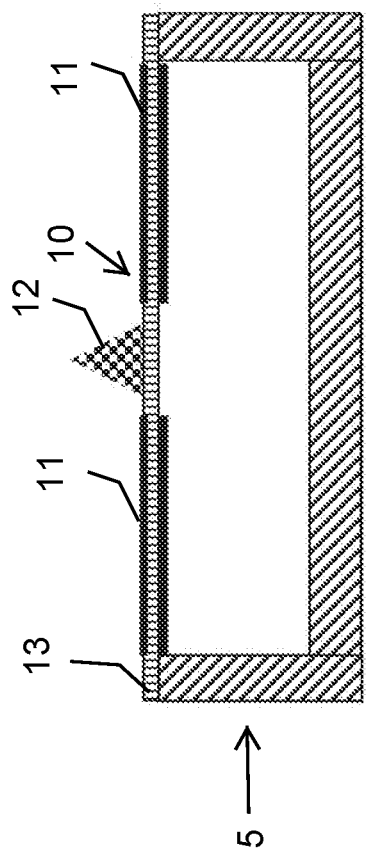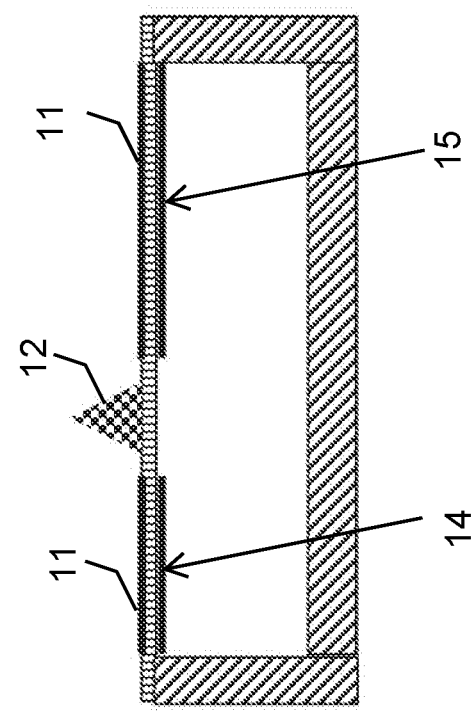

ELASTOMER-BASED CAPACITIVE CONTROL AND OPERATING ELEMENT

BACKGROUND OF THE INVENTION

Field of the Invention

In many technical environments, a variety of operating elements is required for operating electronic devices and machines. This so-called human-machine interface (HMI) is becoming more and more important due to the increasing number of controllable functions. In automobiles, for example, this concerns the operation of simple functions such as lighting, the horn or window lifters. However, this also includes more and more complex controllable systems such as air-conditioning, navigation and entertainment.

In addition, control and operating elements are also required in many other technical systems. The control of many machines is realized by means of suitable user interfaces. The use of electronic devices requires operating elements that are adapted to their function. This not only relates to computers but also to smartphones, game consoles and many other categories of electronic devices. One development still in its infancy is the integration of electronics into clothing. If operating elements should also be integrated into textiles, they must have a flat shape and, if possible, be soft and flexible in order to provide a high wearing comfort.

In the operation of devices, one has to distinguish between different types of interaction. The simplest operating element is a switch that activates and deactivates a desired function such as lights. A more complex operating option requires the control or adjustment of a setting value such as, for example, the brightness or the volume. The adjustment of a multi-dimensional setting value is even more complex. A corresponding example is the control of a mirror that can be adjusted in two axes.

In accordance with a high existing demand, a broad selection of control and operating elements is already available. Push switches, toggle switches or rotary switches are predominantly used for simple switching operations. Rotary switches also allow switching back and forth between more than two setting. Rotary controls and slide controls can be used for adjusting a setting value. An operating method that is meanwhile frequently used, particularly in digital electronics, involves pressing a pushbutton repeatedly or for a defined period of time in order to adjust a setting value. For example, the electric motors for adjusting exterior rearview mirrors in vehicles are controlled in this way. For more complex adjustments such as two-dimensional adjustments with high speed, joysticks, for example, are available. The computer mouse also fulfills such a function. However, these already are relatively elaborate devices requiring much space. Touch displays, which are particularly popular in smartphones, also allow a two-dimensional control. However, since this involves touching a rigid glass plate with the fingers, there is no sensation of compression forces.

The control elements and operating elements used today are typically rigid components. They are usually made of metallic and inflexible plastic components. Accordingly, their shape can subsequently no longer be changed and adapted. To date, no suitable operating elements exist for the use in textiles.

The following patents are cited with respect to the prior art, describing operating elements that are equipped with a capacitive sensor.

DE 10 2010 063 280 describes an operating element with a capacitive sensor. The capacitive sensor system is a proximity sensor system that activates, e.g., a function display or backlighting. A pressure sensor system is not mentioned.

EP 726 655 describes a capacitive switching element, in which a capacitor is compressed from above and the obtained capacitance change is measured. The lower electrode consists of two fields that may be printed-on using conductive metallic ink. The dielectric material thereon consists of a mixture of a ferroelectric and glass. A disk-shaped element made of an electrically conductive, elastic material or of a non-conductive elastic material, which is laminated with a metal foil in the direction of the dielectric, serves as a switching element in this case.

DE 10 2012 210 277 describes a capacitive sensor for detecting the motion of an object, for example a (push-type or toggle-switch) button. One of the two electrodes of the sensor is rigidly connected to the button or mechanically coupled thereto such that the electrode moves when the button is moved. During this motion, its distance from the other fixed electrode changes, and the volume between the two electrodes, which consists partially of a deformable dielectric in the form of a lens and partially of gas, is thereby changed. When the volume is reduced, air is pressed out of the gas volume and is replaced with material of the dielectric resulting in an increase of capacitance change.

U.S. Pat. No. 7,863,822 describes an operating element for an automobile. The operating element contains a dielectric elastomer layer which, in a desired region, is equipped with a front electrode facing the user. A rear electrode is located on the side facing away from the user. When an electric voltage is applied between the two electrodes, the distance between the front electrode and the rear electrode decreases such that the dielectric elastomer is compressed in the desired region. A depression facing the user is formed if the rear electrode does not change its position, and this depression should be sensed by the user as a change of the surface by touching. A structure with depressions on both sides is formed if both electrodes are flexible. In any case, this structure should subsequently be used as a push button, a key or a pressbutton. When a user presses on the operating element, this can be registered by an additional pressure sensor not specified in greater detail, or by measuring a capacitance change between the two electrodes; however, only a residual capability of the elastomer of being compressed is available for this capacitance change. Consequently, this capacitance change can only be relatively small, even if a soft elastomer is chosen for the dielectric layer.

In the technical literature, the capacitive sensing of the deformation of dielectric elastomers is typically used for monitoring actuator applications of dielectric elastomers (Mark Matysek et al.: Combined driving and sensing circuitry for dielectric elastomer actuators in mobile applications, Proc. SPIE 7976, Electroactive Polymer Actuators and Devices (EAPAD) 2011, 797612; doi: 10.1117/12.879438) or for a mere sensor function (Holger Böse; Erich Fu☐: Novel dielectric elastomer sensors for compression load detection, Proc. SPIE 9056, Electroactive Polymer Actuators and Devices (EAPAD) 2014, 905614; doi: 10.1117/12.2045133).

DE 10 2013 004088 T5 discloses an electrically adjustable seat device comprising operating units in the form of capacitance sensors that are composed of two electrodes and an elastomer layer sandwiched between these. The possibility of continuously adjusting a desired setting value and fixing this setting value by means of a triggering process is not disclosed.

Hyung-Kew Lee et al., Journal of Microelectromechanical Systems Vol. 17, No. 4, 2008, pp. 934-942, disclose a flexible touch sensor composed of two polydimethylsiloxane layers with embedded electrodes, as well as an air gap and a column structure arranged in between. The possibility of continuously adjusting a desired setting value and fixing this setting value by means of a triggering process is not disclosed.

SUMMARY OF THE INVENTION

It is an object of the present to provide a control element that can be easily operated with the fingers and allows to continuously adjust one or more desired setting values and, if necessary, to fix these setting values by means of a triggering operation. If necessary, the control element should be flexible and bendable, preferably even stretchable.

This objective is achieved by providing a control and operating element comprising:

a control and operating element comprising:

(a) at least one dielectric elastomer sensor, in which at least two electrode layers, between which a capacitance can be measured, are separated from one another by an at least partially elastomeric dielectric, wherein the sensor has a preset position and can adopt, due to a deformation of elastomeric components, one or more working positions having a different capacitance with respect to the preset position, which is/are reached due to application of an external force, and (b) a triggering mechanism, capable of triggering an event that is associated with a reached working position.

The dielectric elastomer sensor used in accordance with the invention is a sensor that typically extends two-dimensionally. According to the invention, the term "extending flatly" should mean that the sensor is composed of stacked components (layers that may be profiled), which completely or partially consist of elastomer material, wherein each individual component has surface area dimensions which, in the planar directions, are normally at least as large as its thickness, though this is not necessarily the case. The longitudinal and/or lateral dimensions of the entire structure of all components (layers), including the dielectric elastomer sensor, are frequently greater than the thickness of the sensor (measured over its cross section between the outwardly directed outer sides of the (if applicable outermost) two elastomeric electrode layers), and quite often amount to a multiple of its thickness. The ratio of the length and/or width to the thickness is frequently at least two, typically at least five-times and normally at least ten-times the thickness. The length and the width frequently both have these dimensions in relation to the thickness. A cross section through the elastomer sensor is the shortest distance between the outer faces of the two outer or outermost electrode layers through the layers. According to the invention, application of a force in the direction of the cross section is referred to as "perpendicular to the surface direction" and an "application of force effect with at least one component in the surface direction" is an application of a force wherein the two-dimensional component of the sensor are at least partially stretched or compressed in the planar direction.

The aforementioned externally applied force preferably has at least one component in the surface direction of the dielectric elastomer sensor.

Naturally, the two-dimensionally extending dielectric elastomer sensor does not necessarily have to extend exclusively in an x-y plane, but may optionally be bent, folded or corrugated or can adopt another shape that comprises an extension in the spatial z-direction. Further, it is clear that the individual components of the sensor do not always have to be aligned in parallel to one another, though this will typically be the case. In exceptional cases, however, wedge-shaped or other non-parallel arrangements are also possible.

The basic functional principle of the control and operating elements according to the invention comprises measuring the electric capacitance change of dielectric elastomer sensors when these are deformed, particularly with the fingers. Dielectric elastomer sensors (DES) exist in different variations and are used for measuring elongations, tensile forces or compression forces.

The simplest version of a DES is a dielectric elastomer film. It comprises a highly stretchable elastomer film that is coated with likewise highly stretchable electrodes on both sides. The electrodes maintain a sufficient electric conductivity even under high strain. Such a dielectric elastomer film therefore has the form of a two-dimensional capacitor, which will often be flexible, wherein the capacitance depends on the surface area of the electrodes and the thickness of the elastomer film arranged between these. When the dielectric elastomer film is stretched, the surface area increases and the electrode spacing decreases. Both result in an increase of the capacitance. Thus, the dielectric elastomer film acts like a capacitive strain sensor which also allows to measure tensile forces. Such dielectric elastomer films and their sensor effect are already known.

Patent applications EP 2 698 616 A2 and DE 10 2014 201 434 A1 disclose pressure sensor mats, which can also capacitatively measure compression loads with high sensitivity. The basic idea is that a layered composite, composed of a planar elastomer film and one or two elastomer films provided with surface profiles, is deformed upon compression which results in a significant increase of the measured capacitance. The position of the conductive electrode layers in the layered composite is decisively important in this case. Various design options are available for such pressure sensors allowing to adjust the sensitivity within a broad range. A particularly sensitive version can be realized by means of a pressure sensor with an elastomer film between two knob profiles. According to the invention, all of these embodiments can be applied without limiting the invention to these embodiments.

The present invention utilizes the various design options of dielectric elastomer sensors for tensile loads, as well as for compression loads. The control and operating element is deformed, preferably with the fingers of a hand, resulting in a measurable capacitance change. The deformation and therefore also the capacitance change increase as the finger force increases. When the force is retracted, the deformation and the capacitance change are reduced again. The embodiments described below represent control and operating elements with dielectric elastomer sensors for tensile loads, as well as for compression loads, which, when operated, produce very large changes of the measurable electric capacitance and therefore have a high sensitivity.

The dielectric elastomer sensor may comprise an elastomer film that is coated with electrodes or an elastomer film with inwardly directed profiled surfaces that is arranged between two elastomer components. In these instances, the external application of force (compression load) can be at least partially applied perpendicularly to the surface of the elastomer film, wherein, in the first case, the electrodes approach one another due to a compression of the elastomer film, which is associated with a lateral elongation so that the capacitance between the electrodes increases in the working position(s). Since the electrodes are typically stretched together with the elastomer film, the surface area of the elastomer sensor becomes larger which further increases the capacity. In elastomer components with inwardly directed profiled surfaces, these surfaces may be arranged in such a way that the profiles mutually engage into or on one another when the force is applied, which in turn causes a reduction of the spacing between the electrodes. In an alternative variation, an elastomer film provided with electrode layers is located between the profiles. This elastomer film is stretched when the profiles engage into one another, resulting in a capacitance change.

The dielectric elastomer sensor may comprise at least one elastomer component that has a profiled surface on at least one of its sides. In this case, the application of external force changes the shape of the profile of this surface.

A component of the dielectric elastomer sensor may be an elastomer foam that is realized, for example, in the form of a dielectric between two electrode layers. In this case, the application of external force can cause a compression of the elastomer foam.

In some instances, the dielectric elastomer sensor comprises more than one dielectric layer and more than two electrode layers in an alternating layer sequence.

A silicone is preferably used as an elastomer material for the conductive elastomer components and for the non-conductive elastomer components in the control and operating elements. However, other materials can also be used instead, particularly fluorosilicone, polyurethane (PUR), polynorbornene, natural rubber (NR), styrene-butadiene rubber (SBR), isobutylene-isoprene rubber (IIR), ethylene-propylene-diene terpolymer (EPDM/EPM), polychlorobutadiene (CR), chlorosulfonated polyethylene (CSM), acrylonitrile-butadiene (NBR), hydrogenated acrylonitrile-butadiene (HNBR), a fluororubber such as viton, a thermoplastic elastomer such as thermoplastic styrene copolymers (styrene-butadiene-styrene (SBS), styrene-ethylene-butadiene-styrene (SEBS), styrene-ethylene-propylene-styrene (SEPS), styrene-ethylene-ethylene-propylene-styrene (SEEPS) or styrene-isoprene-styrene (SIS) copolymers), partially cross-linked blends on the basis of polyolefin (of ethylene-propylene-diene rubber and polypropylene (EPDM/PP), of nitrile-butadiene rubber and polypropylene (NBR/PP) or of ethylene-propylene-diene rubber and polyethylene (EPDM/PE)) or thermoplastic urethane copolymers (aromatic hard segment and ester soft segment (TPU-ARES), aromatic hard segment and ether soft segment (TPU-ARET) or aromatic hard segment and ester/ether soft segment (TPU-AREE)). Mixtures of two or more of the cited materials are also possible. However, other elastomer materials known from the prior art can also be used.

The non-conductive elastomer component may contain electrically polarizable particles such as barium titanate, lead zirconate titanate or titanium dioxide and/or electrically conductive particles made of carbon such as carbon black, graphite, graphene or carbon nanotubes, metals such as iron, copper, silver or gold or conductive polymers such as polyaniline, polyacetylene, polypyrrole, polyparaphenylene or polythiophene or an organic modification for increasing the permittivity. It goes without saying that electrically conductive particles can only be used in such a quantity that the percolation threshold is not exceeded.

The conductive elastomer components contain conductive particles of carbon such as carbon black, graphite, graphene or carbon nanotubes, metals such as iron, copper, silver or gold or conductive polymers such as polyaniline, polyacetylene, polypyrrole, polyparaphenylene or polythiophene. However, other conductive fillers known from the prior art can also be used. Silicone is preferably used as an elastomeric component for the conductive elastomer components.

In all embodiments of the invention, the electrode layers can at least partially consist of elastomeric components. However, this is not essential: if the electrode layers consist of electrically conductive particles that are applied on the surface of an elastomeric dielectric, they can likewise adapt to the elongation as long as sufficient particles are present in a composite such that there is no falling below the percolation threshold during the elongation. A person skilled in the art is familiar with this fact.

It is clear that, according to the invention, other designs of the dielectric elastomer sensor can also be used as long as this elastomer sensor comprises at least two electrode layers between which a capacitance can be measured, and as long as these electrode layers are separated from one another by an at least partially elastomeric dielectric.

The measured capacitance is used for controlling a setting value in the control and operating element. This is realized though the off position which is linked to an initial value of the setting value such as "off" or "minimal," and one or more working positions in which the capacitance of the dielectric sensor is changed due to the deformation caused by the external application of force. The transition between different working positions may be continuous in this case. In more complex control processes, e.g. with multidimensional setting values, multiple capacitances can be changed, measured and evaluated simultaneously.

According to the invention, the desired value of the respective setting (value) can also be adopted during or after it has been set. To this end, a triggering process is necessary in the control and operating element. Multiple options for the triggering process are proposed; these are preferably each associated with a deformation of an elastomeric element of the control and operating element:

Closing or—vice versa—opening an electric contact, for example, as a result of a predetermined deformation of elastomer components in the control and operating element. An electric circuit may be provided in this case, which is opened or, vice versa, closed in the preset position of the control and operating element and closed or, vice versa, opened in a second or additional working position that acts as trigger position of the control and operating element, wherein the process or event is respectively triggered by the opening or the closing of the contact. Alternatively, contacting an electrically conductive structure on the dielectric elastomer sensor by means of an additional electrical structure can trigger a signal and therefore the process or event. In a preferred embodiment, the electrically conductive components, between which the contact is closed or opened, also consist of an elastomer.

Detecting a defined change of the measured capacitance or a combination of capacitances over time in the control and operating element. To this end, a threshold value for the rate of change of the measured capacitance may be preset, and the event is triggered when said threshold value is exceeded.

Detecting a defined change of a combination of multiple capacitances in the control and operating element. This may be, but does not have to be, a presetting of two capacitance changes in preferably two dielectric elastomer sensors or in two fields of one electric dielectric elastomer sensor. The event is triggered once the combination of these capacitance changes is reached.

Detecting the change of another capacitance or a combination of capacitances in the control and operating element. To this end, an additional dielectric elastomer sensor may, for example, be provided, in which at least two electrode layers, between which a capacitance can be measured, are separated from one another by an at least partially elastomeric dielectric. Such a sensor may be arranged, for example, in a gripping device provided in the control and operating element. A capacitance change of this additional dielectric elastomer sensor can trigger the event.

In the inventive control and operating element, the triggering process is essential because the working position(s), which was/were previously reached due to the deformation of the sensor, and the value or values of the capacitance obtained thereby can be retained and adopted ("triggering an event").

In specific embodiments, the triggering mechanism of the control and operating element can be connected to a snap-action mechanism. This snap-action mechanism is a mechanically bistable element provided with a return spring. When a force is exerted on the sensor, an increasing force is exerted on a surface of the mechanically bistable element which causes an elastic counterforce that initially increases and abruptly decreases once a pressure point is exceeded. Due to this snapping motion, the user experiences a haptic feedback with his hand. The snapping motion simultaneously operates a triggering mechanism, such as the closing or opening of an electric contact. When the exerted force is subsequently reduced, the surface of the element is returned to its starting position by the spring. The components of the snap-action mechanism may be made of elastomer and/or metal.

Also in these embodiments of the invention, the actual triggering process takes place as described above:
1. Closing or opening of an electric contact (also by means of conductive elastomer components)
2. Recording a fast capacitance change
3. Starting the triggering process upon reaching a predetermined combination of at least 2 capacitance changes
4. Recording the change of an additional capacitance.

The invention therefore provides a new category of control and operating elements that are predominantly or completely composed of elastomeric components. This allows to design the control and operating elements flexibly, i.e. in a bendable manner, and if necessary even stretchable. This is realized by the geometric design of the control and operating element on the one hand and on the other hand by the choice of the elastomer materials used.

Due to the elementary basic functions of the new control elements or control and operating elements, the sensor can be transferred into a working position by applying a defined force, particularly with the fingers of a hand, wherein a setting value has a desired value in this position, and wherein a triggering process can then be immediately carried out with the same fingers in order to adopt the desired setting value. Control and operating elements that allow two-dimensional, three-dimensional or even multidimensional adjustments of setting values can thereby be realized with relatively little effort. The design of these elements is highly variable. The sensitivity, with which the control and operating element reacts to the exerted finger pressure, can be adjusted not only by means of the geometric design but also through the choice of the elastomer materials, particularly the degree of chemical cross-linking.

The inventive control elements or control and operating elements are characterized in that they have a relatively simple design, require no expensive materials and can be inexpensively produced. Consequently, they are also suitable for use in many mass markets.

The capacitance change or the different capacitance changes caused by the fingers are converted into the value of a setting (value) or a set of setting parameters by means of a processor in order to adjust a technical system. Examples are the volume of a sound generator, the brightness of a lamp, the beam direction of a lamp or the orientation of a mirror or other optical components. The operator senses the effect of the current setting without disturbing delays and can change it, if necessary. The desired setting is then fixed with the triggering process.

The available capacitances between the electrodes may be associated with values for one or more technical functions or parameters in an evaluation circuit. In the idle state or (off state) of the element, these functions have a predetermined value, for example, "light off" or "light with x lux." If, in the above-described first embodiment of the invention, the sensor is brought to a working position in which the capacitance between the electrodes is changed, this value changes/ these values change, for example to "light with y lux" (e.g. a brighter light) or the like. An element of the invention according to this embodiment therefore serves for controlling one or more such functions or parameters.

The invention is described in greater detail below with reference to further details and specific embodiments.

BRIEF DESCRIPTION OF THE SEVERAL VIEWS OF THE DRAWING

FIG. 1A is a sectional view of a depressed or triggered pressure sensor of the first embodiment;

FIG. 4 is a diagrammatic, sectional view of a third embodiment of the pressure sensor;

FIG. 4A is a sectional view of a triggered pressure sensor of the third embodiment;

DESCRIPTION OF THE INVENTION

Figure 1:
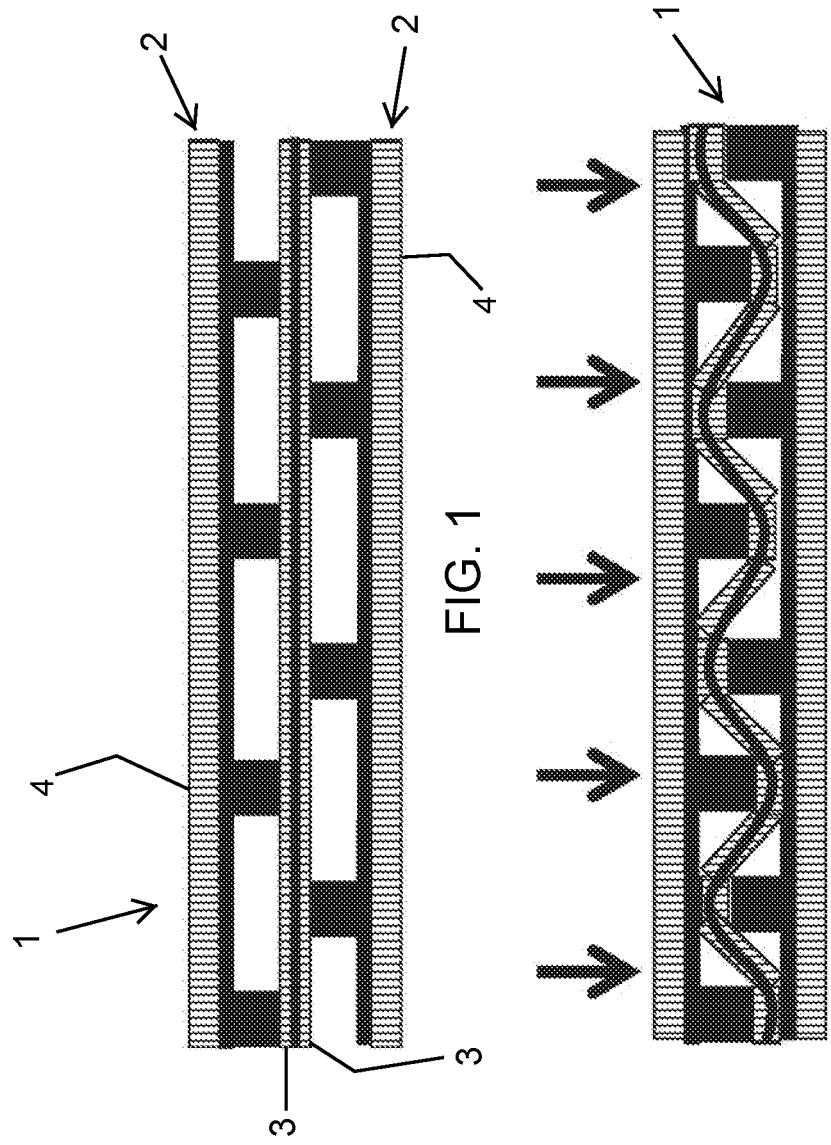
FIG. 1 is a diagrammatic, sectional view of a first embodiment of a pressure sensor.

In a first embodiment of the invention, the capacitance between the electrodes is changed due to the aforementioned external application of force. In addition, the sensor' three-dimensional shape is changed and deformed by the application of force to thereby trigger said event. This is achieved, e.g., by providing a contact structure at the control and operating element, said contact structure being contacted with an electrically conductive structure attached to the sensor during the three-dimensional change or deformation to thereby trigger the event. By connecting the structure located on the sensor and the contact structure, an electric circuit that is open in the idle state (or off state) of the element or a signal is closed or a signal is triggered through the contact between the electrically conductive structure attached to the sensor and the contact structure. An event is triggered in both instances, i.e. the current capacitance(s) are adopted and the technical function or parameter associated with this/these capacitance(s) in the evaluation circuit is effected.

The electrically conductive structure attached to the sensor may be a separate structure that, for example, is arranged laterally on the dielectric elastomer sensor. In this variation, the contact structure is laterally spaced apart from the control and operating element. This contact structure may be integrated, for example, in a frame. If the elastomer sensor is vertically compressed, for example by finger pressure of a person, the sensor, in a first stage of the compression, assumes in this variation a working position in which the capacitance of the sensor is changed, whereby the associated function or the corresponding parameter is changed, which can be observed by this person. Once the desired value is reached, the elastomer sensor is pressed sidewards or sheared until the electrically conductive structure attached to the sensor has reached the contact structure and closes the contact. An event is thereby triggered, namely this value is adopted, i.e. set. This value is maintained even when the application of force on the sensor is stopped.

However, the electrically conductive structure attached to the sensor may also be identical to a surface of one of the electrode layers. In this case, the contact structure is arranged beneath the dielectric elastomer sensor, with respect to the surface facing an operator. In this case, the sensor is laterally deformed until the desired value of the capacitance is set. Subsequently, the sensor is pressed downward in this working position in order to thereby trigger the contact.

Closing the electric circuit is likewise reversible as establishing the contact between a structure attached to the sensor and a contact structure. Since the sensor structures are elastomeric, the contact is opened again when the application of force is reduced. If the force is applied once again, e.g. in order to reach another working position, the contact is closed again.

Also in a second embodiment of the invention, the capacitance between the electrodes is changed by said external application of force. However, the triggering event is in this case only triggered by means of this application of force: in this embodiment, the rate of capacitance change can be measured. The detection of a defined rate of change of the measured capacitance over time triggers the event, e.g. by exceeding a threshold value for the rate of capacitance change. A slow application of force can thereby allow an operator to observe an equivalence between this application of force and the technical function or the parameter to be adjusted. Once the desired value is reached, the application of force is rapidly increased above the threshold value in order to thereby trigger the event, i.e. to set the current value or the reached parameter. In this embodiment of the invention, the force may be applied vertically but may as well be applied horizontally. For this latter variation, the dielectric elastomer sensor, which is preferably realized in the form of a film with electrode layers applied to the surfaces of the film, may be pre-stretched in a frame. The capacitance of the sensor changes when the mechanical stress is increased or decreased by an at least partially horizontal application of force (application of force in the plane of the film).

In a third embodiment of the invention, the event is triggered by a defined change of a combination of multiple capacitances in the control and operating element.

In a fourth embodiment of the invention, the event is triggered by an additional dielectric elastomer sensor. This additional dielectric elastomer sensor may be arranged, for example, in a gripping device that serves to change the capacitance of the otherwise only dielectric elastomer sensor or of one of the available other dielectric elastomer sensors.

In specific embodiments of the invention, the control and operating element comprises a dielectric elastomer sensor which is divided into two or more sensor surfaces. In this case, the electrode surfaces are applied on a dielectric elastomer film or other dielectric components of the elastomer sensor in a structured manner, namely in such a way that electrically isolated electrode fields are formed. The sensor surfaces can be read out electrically and separately via the respective electrode fields. In these embodiments, the dielectric elastomer sensor is preferably pre-stretched, for example, in a frame. When the dielectric elastomer film or the corresponding other dielectric component is laterally displaced, one of two sensor surfaces or a part of the multiple sensor surfaces is/are mechanically relaxed, whereby the spacing between the electrodes increases and the sensor surface(s) becomes/become smaller, which decreases the capacitance of these sensor surfaces. On the other hand, the other sensor surface or the remainder of the multiple sensor surfaces is stretched even further. whereby the spacing between the electrodes decreases and the sensor surface(s) becomes/become larger, which increases the capacitance of these sensor surfaces.

The displacement of the elastomer film can be realized, for example, by means of a gripping device such as a button, which may be arranged on a portion of the elastomer film that is not covered with electrodes. The gripping device preferably is arranged centrally on the film.

In the control and operating elements according to the invention comprising dielectric elastomer sensors that are divided into two or more sensor (sur)faces, the event can be triggered, for example, by a contact structure arranged underneath the sensor surface as described above for the first embodiment of the invention, or by measuring a defined change of the measured capacitance over time or by a simultaneous change of multiple capacitances as described above for the second and third embodiments of the invention. Finally, if a gripping device is provided, it is also possible to accommodate an additional dielectric elastomer sensor therein, in such a way that a compression of the gripping device results in a capacitance change of the additional dielectric elastomer sensor, whereby the event is triggered. The components for the triggering mechanism preferably also consist at least partially of an elastomer.

When two or more sensor surfaces are provided, the relation of the surface area/capacitance of the surfaces with respect to one another can be detected. In the case of four surfaces, the sensor fields can, for example, be arranged squarely or rectangularly or circularly, namely in such a way that two isolating regions separating the sensor fields intersect centrally. A gripping device, e.g. a button, may be arranged at the intersection. In this embodiment, the motion of the button can be two-dimensionally controlled and detected on a surface by means of the capacitance changes of the sensor fields, such as by a cursor. In that case, the control and operating elements according to the invention can also be used like a computer mouse, wherein the dimensions of this element can be significantly smaller than a mouse, e.g. having an area of 5-10 cm$^2$.

In a specific variation of the invention, the control and operating element comprises multiple dielectric elastomer sensors that are associated with respectively different functions or parameters, if applicable with the exception of one such sensor as means for triggering the aforementioned event. These dielectric elastomer sensors may be realized in the form of walls of an imaginary or actually existing three-dimensional space, e.g. a cube, wherein the force should be exerted on their respective inner sides. In order to make this possible, a three-dimensional body is provided in the interior of the space and can be moved by means of a rod extending outwards from that space in order to thereby apply an external force on one or more of the dielectric elastomer sensors. The gripping device may be provided with an additional dielectric elastomer sensor for triggering the event as described above with reference to the dielectric elastomer sensors that are divided into at least two sensor surfaces.

In preferred embodiments of the invention, the control and operating element of the present invention comprises an electrically isolating layer, which is located on the surface of the two-dimensionally extending dielectric elastomer sensor that faces an operator. This layer, which may also serve as cover layer, is in mechanical contact with the dielectric elastomer sensor in such a way that the external force can be exerted on the dielectric elastomer sensor via its surface. This cover layer may extend over the entire surface of the dielectric elastomer sensor; if the electrode layers are realized in structured form, however, it may alternatively also be provided only on the electrically conductive structures. Also the electrode layer facing away from the user may in some embodiments be provided with a non-conductive cover layer if it is not required for contacting purposes.

In all embodiments of the invention, it is advantageous if the deformability of the elastomer components is so large that the distance between two selected positions can change by at least 10%, preferably by at least 30%, particularly by at least 50%, in the elastomer. This is achieved, for example, by utilizing dielectric elastomer sensors of the type described in EP 2 698 616 A2 and DE 10 2014 201 434 A1.

In further specific embodiments that can be combined with all other embodiments of the invention, the material, of which the control and operating element of the invention is made, is at least partially transparent such that light can be transmitted from the rear side (facing away from the user) or from another side to the front side facing the user through the control and operating element. The light of such a backlighting arrangement can reach the front side of the control and operating element, for example, through an interruption in the electrodes.

A dielectric elastomer sensor in mechanically pre-stretched form is used in many embodiments of the invention. In order to stabilize the pre-stretch, the elastomer sensor may be fixed in a frame in these instances.

The elastomer sensor can also be covered with a plate or with another mechanical intermediate part such that the touching finger comes in contact with the plate or the intermediate part and not directly with the sensor. This causes modified haptic characteristics when touched.

The control and operating element can also be equipped with a capacitive proximity sensor system, wherein additional electrode layers on the surface of the control and operating element register the approach of a hand through a change of the electric field extending into the by a hand, whereby the capacitance measured at the additional electrode layers changes.

Setting values of technical functions can be adjusted and fixed with the fingers by a targeted application of force using the elastomer-based capacitive control and operating element. This concerns a new category of human-machine interfaces. Due to the broad design variety, the control and operating element can be adapted to the requirements in many fields of application.

Particular advantages are the simple design, the use of inexpensive materials and the resulting low production costs. Consequently, this technology is also suitable for mass markets. In contrast to most currently available operating elements, the use of elastomeric components allows to design the novel control and operating elements to be flexible and, if necessary, also stretchable. This approach furthermore allows to realize operating elements for controlling multidimensional setting values.

- Control of various technical functions in automobiles such as, among other things, lighting, mirror adjustment, air-conditioning system, navigation and entertainment
- Human-machine interfaces for controlling machines, if applicable also for complex sequences, replacement of joysticks
- Operating elements for controlling electric household appliances such as washing machines, kitchen appliances, vacuum cleaners, lawn mowers, etc.
- Utilization in electronic devices such as televisions, stereos systems, computers, etc.
- Utilization in mobile devices such as laptops, notebooks, smartphones, cameras, etc.
- Integration into textiles, articles of clothing, as well as other flexible environments such as seat cushions, beds, foam paneling, etc.

The control and operating element according to the invention can therefore be used inter alia for controlling technical functions in vehicles, machines and medical apparatuses, as well as for operating electronic devices such as computers, tablets, smartphones and game consoles. It is further suitable for controlling technical functions on the body, also by being integrated into textiles and articles of clothing, as well as into other flexible environments such as seats, beds, foam paneling, etc.

This new category of control and operating elements can be used in a very large number of applications in different environments:

- In vehicles, many adjustments can be carried out with the control and operating elements. Examples are the intensity and the direction of lights, the volume of the sound system, mirror adjustments, the air-conditioning system and the navigation system. Specific options are available due to the novel control and operating elements being soft and flexible. This allows integrating them at unusual locations such as on the steering wheel, in interior linings or seats.

For operating machines, the novel control and operating elements can likewise be used at different locations, for example in order to control motions. This also applies to future generations of robots.

Another field of application involving large quantities, are household appliances including washing machines, large and small kitchen appliances and even lawn mowers. Operating functions in chairs, beds or pieces of furniture would also be conceivable.

A field of application for operating elements, which currently is still largely undeveloped, are textiles and clothing. The increasing distribution of mobile electronic devices also increases the demand for operating options directly on the clothing. The novel flexible control and operating elements have significant advantages in this respect.

EXAMPLES

Example 1

FIG. 1 shows a side view of a pressure sensor 1 that consists of two elastomer films 2 with knob profiles and electrode coatings of a conductive elastomer on the inside. An elastomer film 2 with a conductive inner layer 3 and non-conductive outer layers 4 is arranged between the knobs/protrusions. The conductive inner layer 3 serves as counter electrode to the outer electrode layers 4; FIG. 1 shows the sensor in the state without applied pressure. In FIG. 1A, the sensor 1 is illustrated in the compressed state. During the compression, the electrode layers approach one another, whereby the capacitance increases. Such pressure sensors are already known from EP 13 180 789.3.

Figure 2:
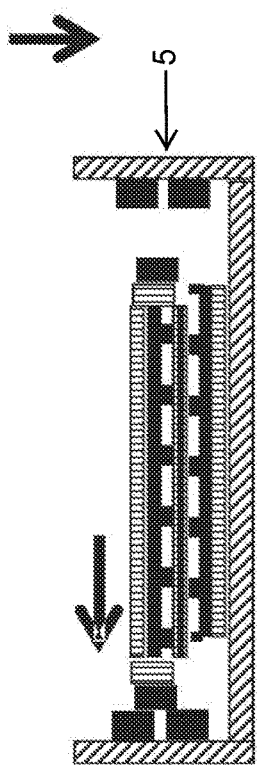
FIG. 2 is a diagrammatic, sectional view of a second embodiment of the pressure sensor.
Figure 2A:
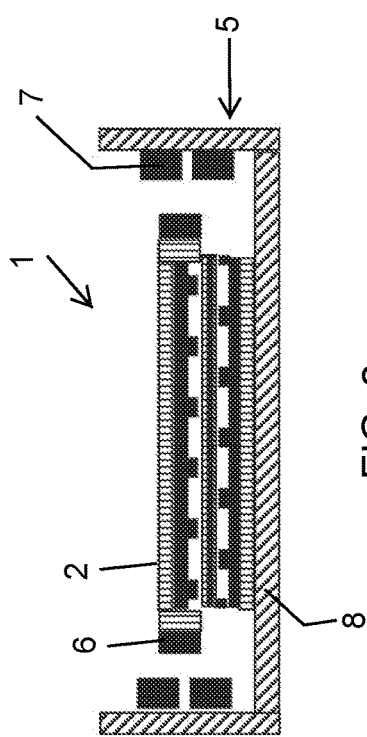
FIG. 2A is a sectional view of a triggered pressure sensor of the second embodiment.

FIG. 2 shows a side view of a control and operating element of a pressure sensor 1 as illustrated in FIG. 1 and comprising an additional contact strip 6 of conductive elastomer on the upper elastomer film 2 having a knob profile. Another contact strip 7 of conductive elastomer with an interruption is arranged on an outer part of the control and operating element 5. This additional contact strip 6 forms part of an electric circuit—which is initially open. When the interruption is bridged, a connected electric circuit connected thereto is closed. In this embodiment, the sensor 1 is fixedly attached to a substrate 8. When a shear force is applied in the center of the control and operating element, the upper side is laterally displaced which triggers an electric contact. The left FIG. 2 shows the control and operating element in the non-triggering state and the right FIG. 2A shows the control and operating element 5 in the triggering state due to shearing.

Figure 3:
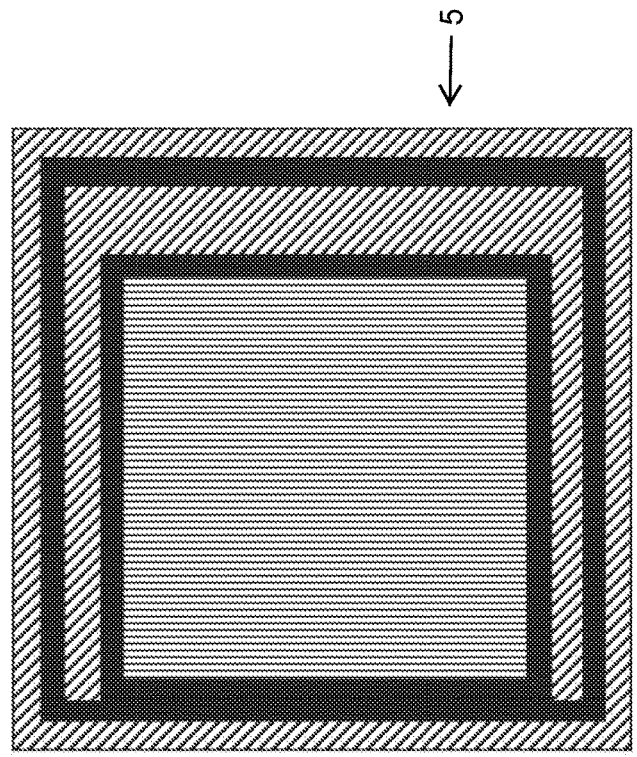
FIG. 3 is a diagrammatic, top view of the second embodiment of the pressure sensor.
Figure 3A:
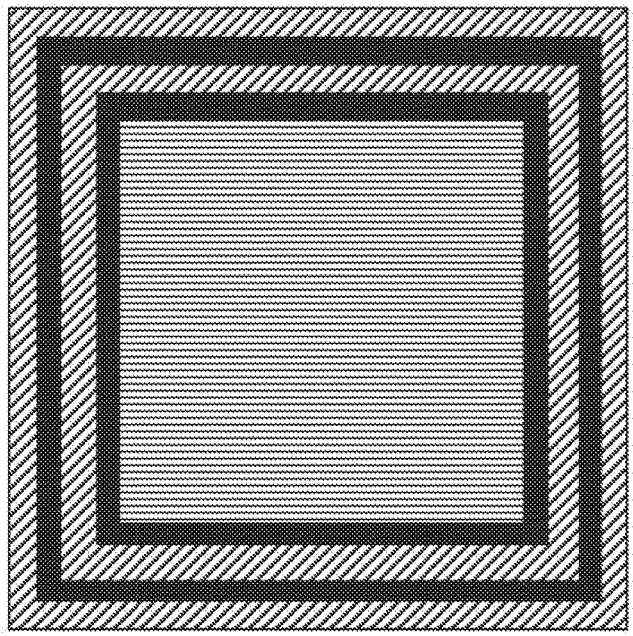
FIG. 3A is a top view of a triggered pressure sensor of the second embodiment.

FIG. 3 shows the same control and operating element in a top view. FIG. 3 shows the control and operating element 5 in the non-triggering state and FIG. 3A shows the control and operating element 5 in the triggering state due to shearing.

Example 2

FIG. 4 shows a side view of a control and operating element 5 comprising a film sensor 10 comprising two separate electrode fields and a finger knob 12 arranged centrally at the top. The electrodes 11 of the two electrode fields are applied to the top and the bottom of the non-conductive elastomer film 13. A dielectric elastomer film with two separate electrode fields is already known for actuator applications. FIG. 4 shows the control and operating element in the non-operated state and FIG. 4A shows the control and operating element in the state of being displaced toward the left. Due to the leftward displacement of the finger knob 12, the capacitance of the left electrode field 14 is reduced and the capacitance of the right electrode field 15 is increased. A triggering can be realized with a fast motion toward the left or the right. Alternatively, the finger knob 12 could also be pressed downward such that both capacitances increase.

Figures 5, 5A:
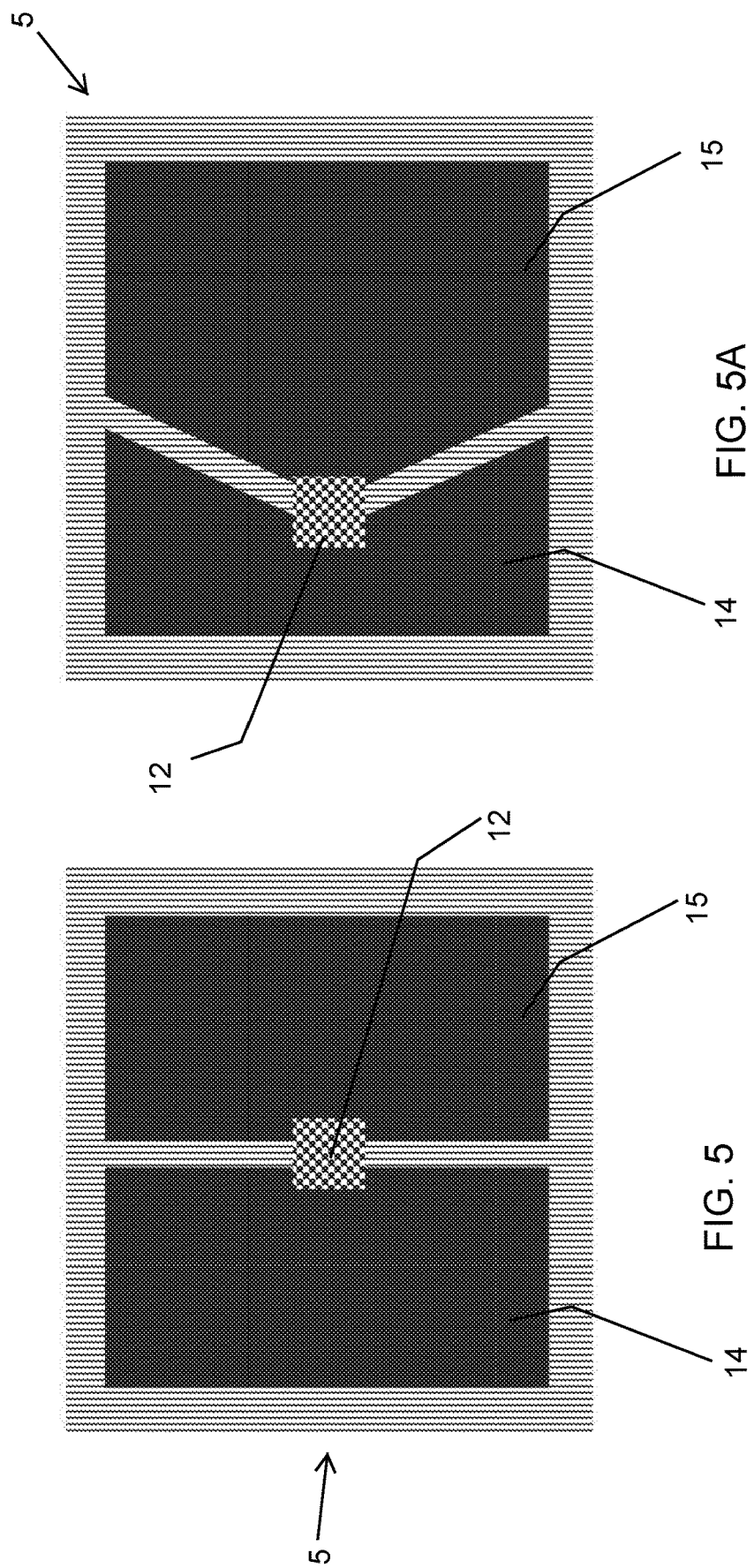
FIG. 5 is a diagrammatic, top view of a third embodiment of the pressure sensor.
FIG. 5A is a top view of a triggered pressure sensor of the third embodiment.

FIG. 5 shows a top view of a control and operating element 5 according to FIG. 4 having a film sensor, comprising two separate rectangular electrode fields 14, 15 and a centrally arranged finger knob 12. FIG. 5 shows the control and operating element 5 in the non-operated state and FIG. 5A shows the control and operating element 5 in the state of being displaced toward the left.

Figure 6A:
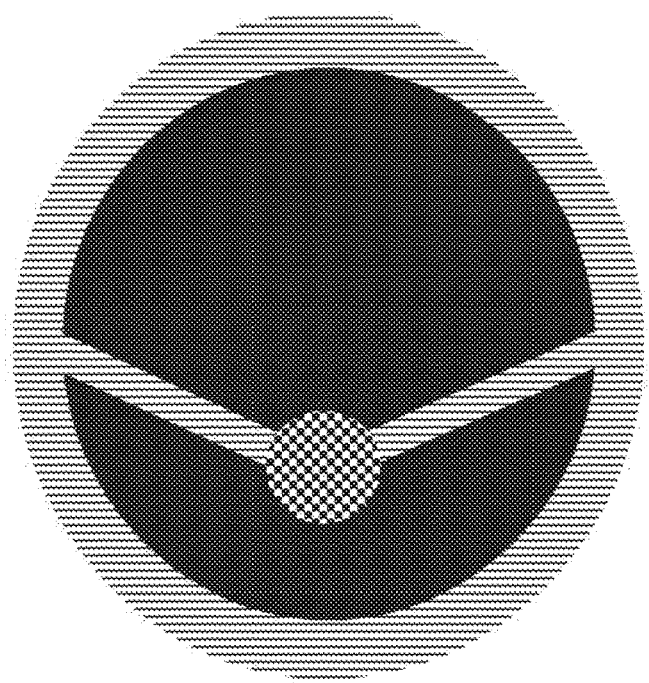
FIG. 6A is a top view of a triggered pressure sensor of the fourth embodiment.
Figure 6:
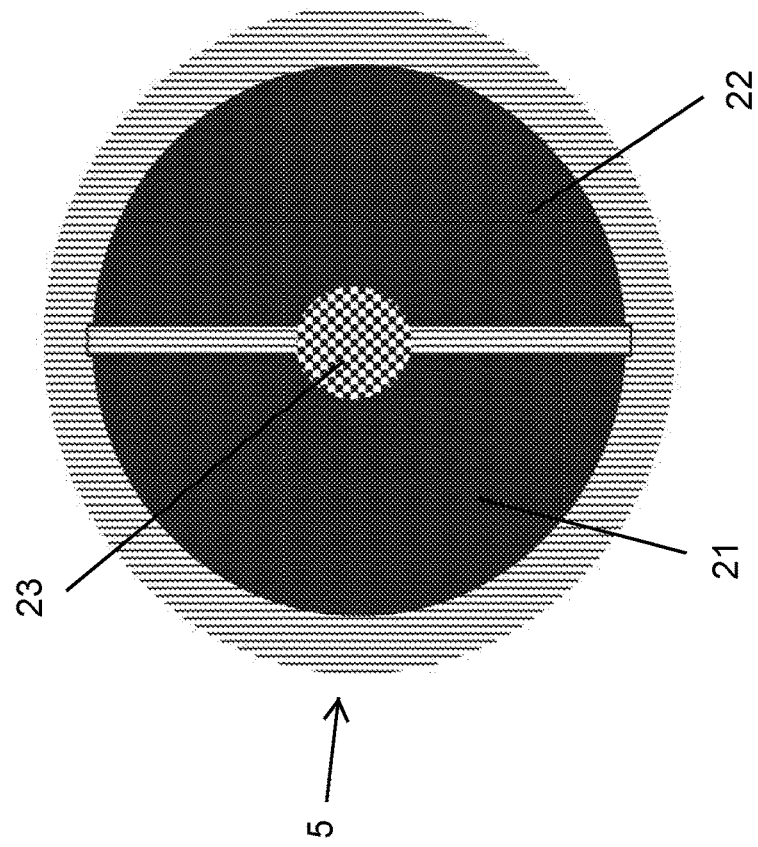
FIG. 6 is a diagrammatic, top view of a fourth embodiment of the pressure sensor.

FIG. 6 shows a top view of a control and operating element 5 according to FIG. 4 having a film sensor, comprising two separate electrode fields 21, 22 in the form of circle segments and a centrally arranged finger knob 23. FIG. 6 shows the control and operating element in the non-operated state and FIG. 6A shows the control and operating element 5 in a state of being displaced toward the left. In this example, a triggering mechanism may be accommodated, e.g., in the finger knob 23.

Example 3

Figures 7, 7A, 7B:
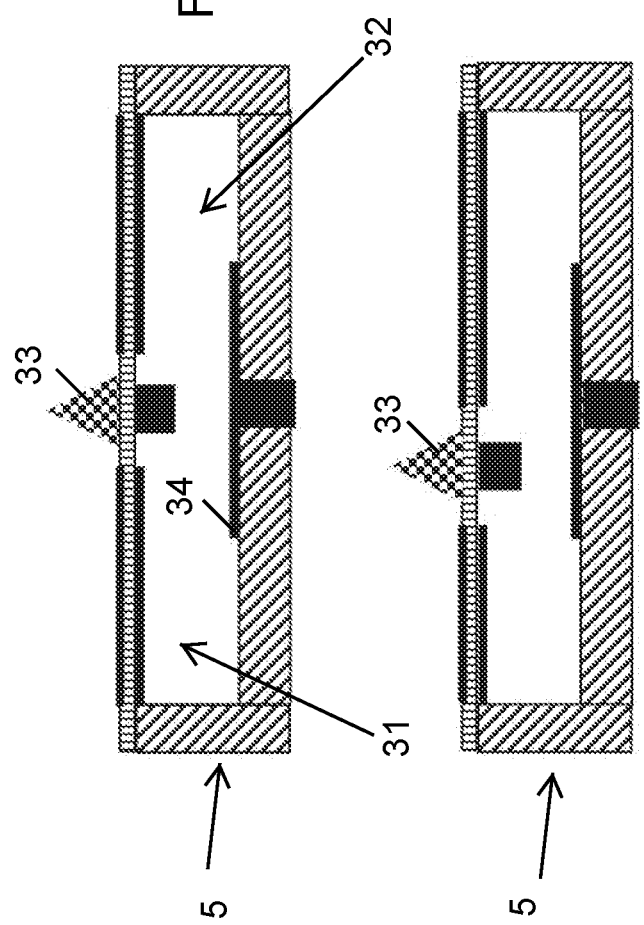
FIG. 7 is a diagrammatic, sectional view of a fifth embodiment of the pressure sensor.
FIG. 7A is a sectional view of a shifted pressure sensor of the fifth embodiment.
FIG. 7B is a sectional view of a trigger pressure sensor of the fifth embodiment.

FIG. 7 shows a side view of a control and operating element 5 with a film sensor comprising two separate electrode fields 31, 32 and a finger knob 33 arranged centrally at the top, as well as contact elements 34 on the bottom. When the finger knob 33 is pressed downward, an electric contact is closed at the bottom for triggering. FIG. 7 shows the control and operating element 5 in the non-operated state, FIG. 7A shows the control and operating element 5 in the state of being displaced toward the left, and FIG. 7B shows the control and operating element 5 in the triggering state.

Example 4

Figures 8, 8A:
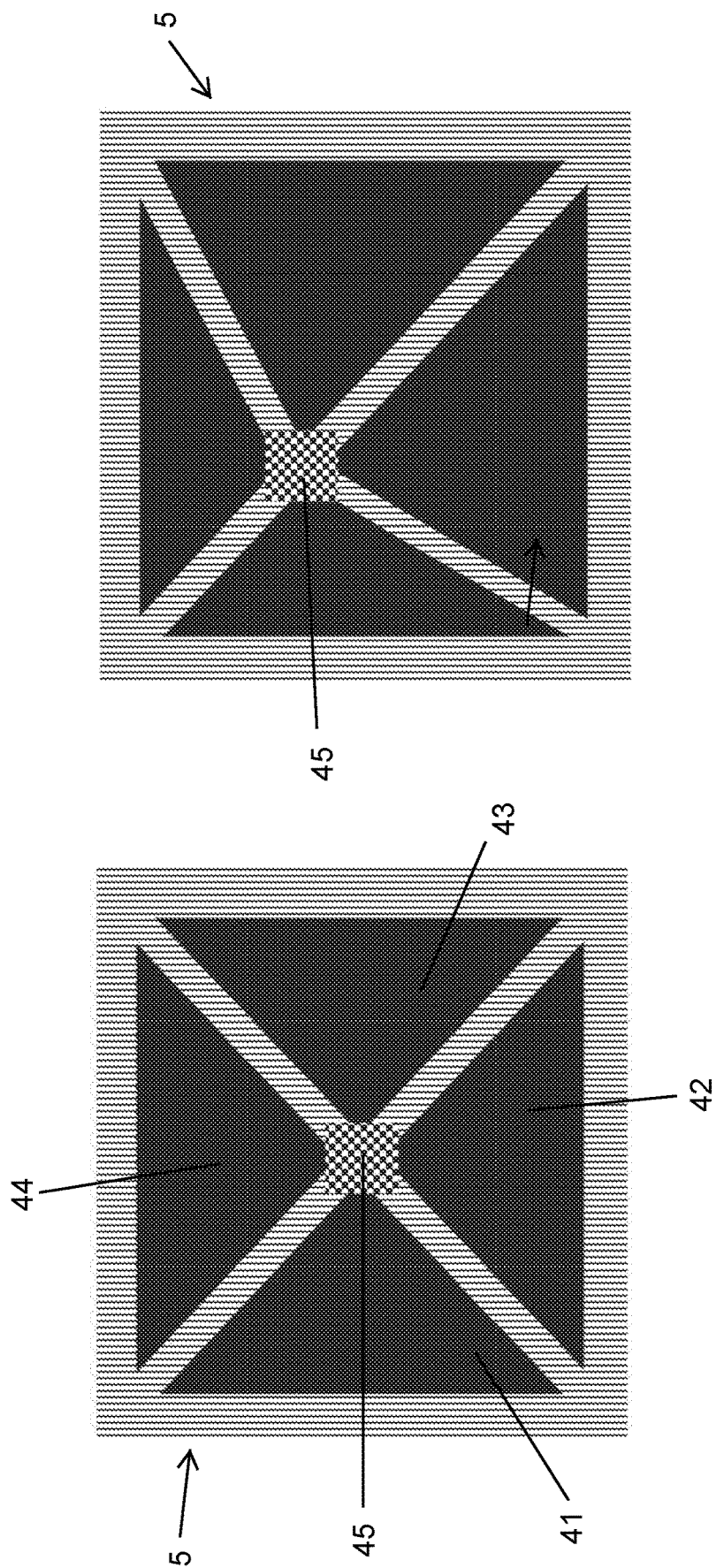
FIG. 8 is a diagrammatic, top view of a sixth embodiment of the pressure sensor.
FIG. 8A is a top view of a triggered pressure sensor of the sixth embodiment.

FIG. 8 shows a top view of a control and operating element 5 having a film sensor comprising four separate rectangular electrode fields 41, 42, 43, 44 and a centrally arranged finger knob 45. FIG. 8 shows the control and operating element 5 in the non-operated state and the right FIG. 8A shows the control and operating element 5 in a state of being displaced toward the left.

Figure 9A:
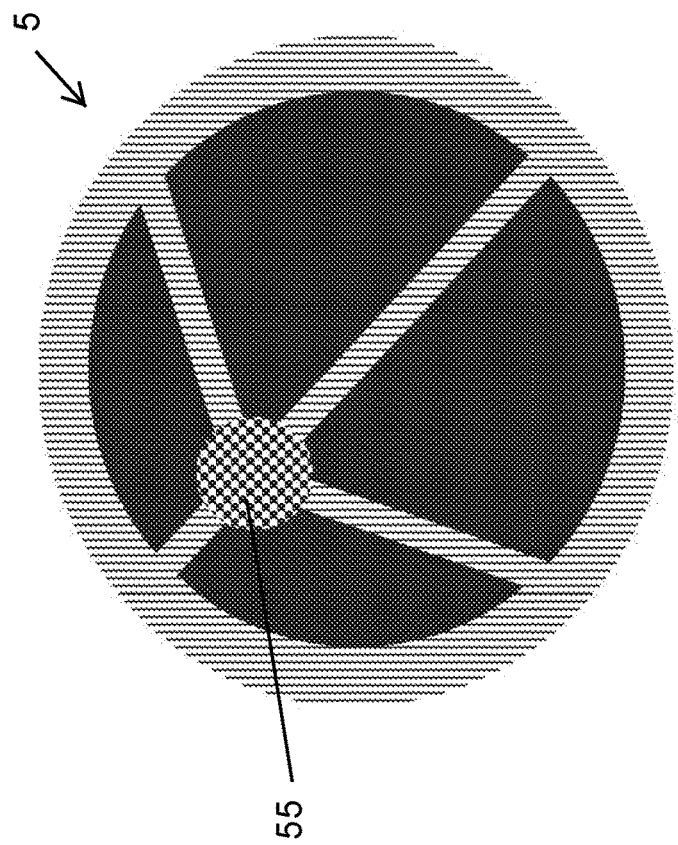
FIG. 9A is a top view of a triggered pressure sensor of the seventh embodiment.
Figure 9:
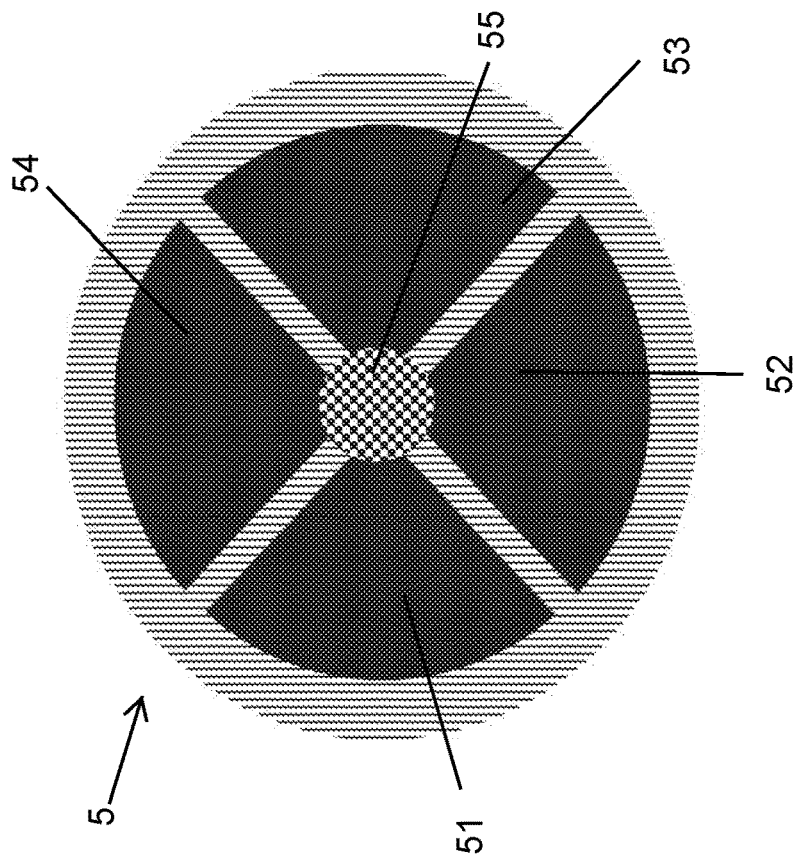
FIG. 9 is a diagrammatic, top view of a seventh embodiment of the pressure sensor.

FIG. 9 shows a top view of a control and operating element 5 having a film sensor comprising four separate electrode fields 51, 52, 53, 54 in the form of circle segments and a centrally arranged finger knob 55. FIG. 9 shows the control and operating element in the non-operated state and FIG. 9A shows the control and operating element 5 in a state of being displaced toward the left.

Example 5

Figure 10:
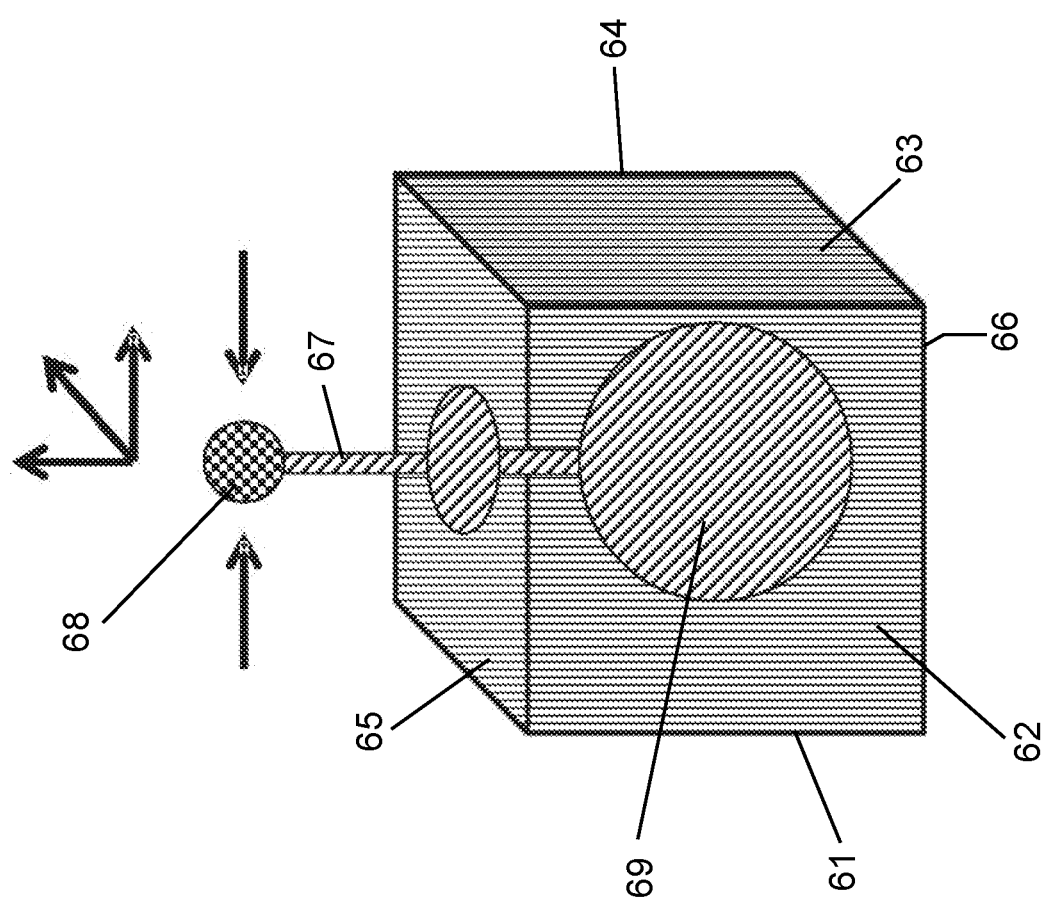
FIG. 10 is a diagrammatic, perspective view of an eighth embodiment of the pressure sensor.

FIG. 10 shows a control and operating element comprising 6 pressure sensors 61, 62, 63, 64, 65, 66 on the surfaces of a cube and an operating rod 67 comprising a finger knob 68. The 5 pressure sensors have protrusion profiles as illustrated in FIG. 1 and can be correspondingly compressed. A ball or a differently shaped three-dimensional body 69 in the interior of the cube is displaced due to the motion of the finger knob 68 and, depending on the direction of the motion, presses on different pressure sensors the capacitance of which can be measured separately. A three-dimensional displacement of the finger knob is thereby measured. If the finger knob is equipped with a further integrated pressure sensor, the triggering can be carried out by compressing the finger knob.

The invention claimed is:

1. A control and operating element for being actuated by fingers of a user of the control and operating element, comprising:
   at least one dielectric elastomer sensor having at least two electrode layers and between said electrode layers a capacitance being measured, said electrode layers being separated from one another by an at least partially elastomeric dielectric, said at least one dielectric elastomer sensor extending flatly, and said electrode layers and said at least partially elastomeric dielectric being stacked layers;
   said dielectric elastomer sensor having a preset position and can adopt, owing to a deformation of said at least partially elastomeric dielectric, at least one working position having a different capacitance with respect to the preset position, the working position being reached by an application of an external force being applied by at least one finger of the user and said dielectric elastomer sensor configured for being actuated by the at least one finger, wherein a measured capacitance is used to control a setting value in the control and operating element; and
   a triggering mechanism, capable of triggering an event that is associated with the working position.

2. The control and operating element according to claim 1, wherein:
   a1) said dielectric elastomer sensor has an elastomer film that is coated with electrodes, or said elastomer film is disposed between two elastomer components having inwardly directed profiled surfaces, or said elastomer film has a parallel disposed elastomer component containing a profiled surface facing the film; and
   a2) an external application of force can at least partially be exerted perpendicularly to a surface of said elastomer film; or
   b) said dielectric elastomer sensor contains at least one elastomer component having a profiled surface on at least one side, or contains an elastomer foam, and wherein the external application of force can be exerted by a change of a shape of a profile of a surface or by compression of said elastomer foam.

3. The control and operating element according to claim 1, wherein said electrode layers are formed at least partially of elastomeric components.

4. The control and operating element according to claim 1, wherein said triggering mechanism:
   (a) further comprising an electric circuit that is open in the preset position of said dielectric elastomer sensor and closed in a triggering position of the control and operating element, or which is closed in the preset position of said dielectric elastomer sensor and open in the triggering position of the control and operating element;
   (b) comprises measuring a rate of capacitance change between said electrode layers and a threshold value for the rate is preset, wherein the event is triggered when the threshold value is exceeded; or
   (c) comprises measuring at least two capacitance changes, and a combination of at least the two capacitance changes is preset, wherein the event is triggered when said combination is realized; or
   (d) further comprising an additional dielectric elastomer sensor having at least two further electrode layers, between which a capacitance can be measured, and said further electrode layers are separated from one another by a further at least partially elastomeric dielectric, wherein a capacitance change of said additional dielectric elastomer sensor triggers the event.

5. The control and operating element according to claim 1, wherein said at least one dielectric elastomer sensor is a two-dimensionally extending elastomer sensor.

6. The control and operating element according to claim 4, wherein said dielectric elastomer sensor contains an electrically conductive structure on at least one lateral region and an interrupted electric circuit which has, laterally displaced to said electrically conductive structure, a bridgeable structure which, when bridged, closes said electric circuit, wherein a first component of the externally applied force perpendicular to a surface direction of said dielectric elastomer sensor causes a change of the capacitance between said electrodes, and wherein a second component of the externally applied force in the surface direction of said dielectric elastomer sensor laterally displaces parts of said dielectric elastomer sensor in such a way that said electrically conductive structure on at least one of lateral ends of said dielectric elastomer sensor can contact said bridgeable structure on both sides in order to thereby close the interrupted electrical circuit and thereby trigger the event.

7. The control and operating element according to claim 4, further comprising an interrupted circuit having a bridgeable structure that is spaced apart from said dielectric elastomer sensor, wherein a first component of the externally applied force in a surface direction of said dielectric elastomer sensor causes a change of the capacitance between said electrodes, and a second component of the externally applied force perpendicular to said dielectric elastomer sensor presses an electrically conductive structure of said dielectric elastomer sensor in a direction of said bridgeable structure in such a way that said electrically conductive structure contacts said bridgeable structure on both sides in order to thereby close the interrupted circuit and trigger the event.

8. The control and operating element according to claim 7, wherein said bridgeable structure is disposed on a side of said dielectric elastomer sensor that faces away from a person operating the control and operating element.

9. The control and operating element according to 1, wherein said dielectric elastomer sensor has at least two sensor fields that are disposed adjacent to one another in a plane and electrode surfaces of said sensor fields are not in contact with one another, wherein said two sensor fields are mechanically pre-stretched and, in response to an application of force, at least one of said sensor fields is stretched further mechanically while a tension is increased, and a mechanical stress in at least one of said sensor fields is reduced, whereby a size of said sensor fields changes with respect to one another, a thickness of a dielectric surface between said at least two electrodes is reduced in the mechanically stretched field and a thickness of a dielectric face between said at least two electrodes is increased in the sensor field with reduced mechanical stress, whereby the capacitance of the mechanically stretched field is increased and the capacitance of the sensor field with reduced mechanical stress is decreased.

10. The control and operating element according to claim 9, wherein said at least two sensor fields of said dielectric elastomer sensor, which are disposed adjacent to one another in a plane, are realized in that at least two elastomeric electrode layers are applied on a dielectric elastomer layer in structured form in such a way that each of said elastomeric electrode layers forms at least two electrically independent regions in said sensor fields.

11. The control and operating element according to claim 9, wherein the capacitance of said two sensor fields, which are disposed adjacent to one another in a plane, can be measured separately.

12. The control and operating element according to claim 4, wherein the stretching or the reduction of the stress of each of said sensor fields is measured as a function of time in such a way that the event is triggered when the threshold value for the rate is exceeded.

13. The control and operating element according to claim 9, wherein the stretching or the reduction of the stress of each of said sensor fields is detected in relation to the stretching and the reduction of the stress in at least the second field or each additional field, respectively.

14. The control and operating element according to claim 9, wherein said two sensor fields are two of at least four sensor fields, which are disposed adjacent to one another in a plane, which are separated from each another by two intersecting, electrically insulating regions, wherein a relation of the measured capacitance is detected with respect to an intersecting point of said electrically insulating regions and can be displayed in a form of a two-dimensional surface point in such a way that the application of an external force in a surface direction of said dielectric elastomer sensor can be displayed as a two-dimensional motion vector.

15. The control and operating element according to claim 1, further comprising an electrically insulated gripping device which is attached on a surface of said dielectric elastomer sensor that faces an operating person.

16. The control and operating element according to 1, wherein at least an outer or outermost of said electrode layers is covered with an electrically insulating layer.

17. A control and operating element for being actuated by fingers of a user of the control and operating element, comprising:
at least two dielectric elastomer sensors extending two-dimensionally in two different directions in space, each of said dielectric elastomer sensors having at least two electrode layers between which a capacitance can be measured, said two electrode layers of each of said dielectric elastomer sensors are separated from one another by an at least partially elastomeric dielectric, said at least two dielectric elastomer sensors extending flatly, and said at least two electrode layers of each of said dielectric elastomer sensors and said at least partially elastomeric dielectric being stacked layers, each of said dielectric elastomer sensors having a preset position and can adopt, owing to a deformation of said dielectric elastomer sensor, at least one working position having a different capacitance with respect to the preset position, which is reached by an application of an external force being applied by at least one finger of the user and said dielectric elastomer sensors configured for being actuated by the at least one finger, wherein a measured capacitance is used to control a setting value in the control and operating element;
a triggering mechanism capable of triggering an event that is associated with a reached working position; and
a three-dimensional body having a gripping device, said dielectric elastomer sensors and said three-dimensional body disposed relative to one another in space such that said three-dimensional body lies between said dielectric elastomer sensors and, controlled by said gripping device, can exert an external force on each of said dielectric elastomer sensors.

18. The control and operating element according to claim 17,
wherein said triggering mechanism is disposed in said gripping device;
further comprising an additional dielectric elastomer sensor having at least two further electrode layers, between said electrode layers a capacitance can be measured, and said further electrode layers being separated from one another by a further at least partially elastomeric dielectric, and wherein a capacitance change of said additional dielectric elastomer sensor triggers the event.

19. The control and operating element according to claim 17, wherein said two dielectric elastomer sensors are two of six dielectric elastomer sensors which form six faces of a cube or cuboid and said gripping device protrudes out of said cube or cuboid through an opening in one of said elastomer sensors.

20. An operating method, which comprises the steps of:
providing a control and operating element being actuated by fingers of a user of the control and operating element, containing:
at least one dielectric elastomer sensor having at least two electrode layers and between the electrode layers a capacitance being measured, the electrode layers being separated from one another by an at least partially elastomeric dielectric, said at least one dielectric elastomer sensor extending flatly, and said electrode layers and said at least partially elastomeric dielectric being stacked layers;
the dielectric elastomer sensor having a preset position and can adopt, owing to a deformation of the at least partially elastomeric dielectric, at least one working position having a different capacitance with respect to the preset position, which is reached by an application of an external force being applied by at least one finger of the user and the dielectric elastomer sensor configured for being actuated by the at least one finger, wherein a measured capacitance is used to control a setting value in the control and operating element; and
a triggering mechanism, capable of triggering an event that is associated with a reached working position; and
using the control and operating element to control technical functions in vehicles, machines, medical apparatuses, electronic devices, computers, tablets, smartphones or game consoles by actuating the control and operating element with the at least finger of the user.

21. An operating method, which comprises the steps of:
providing a control and operating element, containing:
at least one dielectric elastomer sensor having at least two electrode layers and between the electrode layers a capacitance being measured, the electrode layers being separated from one another by an at least partially elastomeric dielectric, said at least one dielectric elastomer sensor extending flatly, and said electrode layers and said at least partially elastomeric dielectric being stacked layers;

the dielectric elastomer sensor having a preset position and can adopt, owing to a deformation of the at least partially elastomeric dielectric, at least one working position having a different capacitance with respect to the preset position, which is reached by an application of an external force being applied by at least one finger of the user and the dielectric elastomer sensor configured for being actuated by the at least one finger, wherein a measured capacitance is used to control a setting value in the control and operating element; and a triggering mechanism, capable of triggering an event that is associated with a reached working position; and using the control and operating element for controlling technical functions on a body, in a form of an element that is integrated into a flexible or pliable material, a textile, an article of clothing, a seat, a bed or a foam paneling.

22. A method for adjusting a setting value to a desired value and for fixing the desired value by triggering an event by means of a control and operating element being actuated by fingers of a user of the control and operating element, the control and operating element containing:

at least one dielectric elastomer sensor having at least two electrode layers and between the electrode layers a capacitance being measured, the electrode layers being separated from one another by an at least partially elastomeric dielectric, said at least one dielectric elastomer sensor extending flatly, and said electrode layers and said at least partially elastomeric dielectric being stacked layers;

the dielectric elastomer sensor having a preset position and can adopt, owing to a deformation of the at least partially elastomeric dielectric, at least one working position having a different capacitance with respect to the preset position, which is reached by an application of an external force being applied by at least one finger of the user and the dielectric elastomer sensor configured for being actuated by the at least one finger, wherein a measured capacitance is used to control a setting value in the control and operating element; and a triggering mechanism, capable of triggering an event that is associated with a reached working position;

which method comprises the steps of:

adjusting the setting value by reaching a working position of the dielectric elastomer sensor where the capacitance between the electrode layers is changed with respect to the preset position;

triggering the event which is associated with the reached working position, wherein the triggering is caused by the triggering mechanism, the triggering mechanism includes:

(i) an electric circuit that is open in the preset position of the dielectric elastomer sensor and closed in a triggering position of the control and operating element, or which is closed in the preset position of the dielectric elastomer sensor and open in the triggering position of the control and operating element; or (ii) measuring a rate of capacitance change between the two electrode layers and a threshold value for the rate is preset, wherein the event is triggered when a threshold value is exceeded; or (iii) measuring at least two capacitance changes between the two electrode layers, wherein a combination of at least two capacitance changes is preset, wherein the event is triggered when the combination is reached, or (iv) comprises an additional dielectric elastomer sensor having at least two further electrode layers, between which a capacitance can be measured, are separated from one another by a further at least partially elastomeric dielectric, wherein a capacitance change of the additional dielectric elastomer sensor triggers the event.

* * * * *